(12) United States Patent
Banda et al.

(10) Patent No.: US 9,447,365 B2
(45) Date of Patent: Sep. 20, 2016

(54) ENHANCED CLEANING PROCESS OF CHAMBER USED PLASMA SPRAY COATING WITHOUT DAMAGING COATING

(71) Applicant: Applied Materials, Inc., Santa Clara, CA (US)

(72) Inventors: Sumanth Banda, San Jose, CA (US); Jennifer Y. Sun, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 690 days.

(21) Appl. No.: 13/757,646

(22) Filed: Feb. 1, 2013

(65) Prior Publication Data

US 2014/0221188 A1 Aug. 7, 2014

Related U.S. Application Data

(60) Provisional application No. 61/676,822, filed on Jul. 27, 2012.

(51) Int. Cl.
  *B08B 3/04* (2006.01)
  *C11D 7/08* (2006.01)
  *C11D 11/00* (2006.01)
  *B08B 3/12* (2006.01)
  *H01L 21/02* (2006.01)

(52) U.S. Cl.
  CPC ............. *C11D 7/08* (2013.01); *C11D 11/0047* (2013.01); *B08B 3/04* (2013.01); *B08B 3/12* (2013.01); *H01L 21/02057* (2013.01)

(58) Field of Classification Search
  None
  See application file for complete search history.

(56) References Cited

U.S. PATENT DOCUMENTS

| 5,972,123 | A | 10/1999 | Verhaverbeke |
| 2006/0054181 | A1 | 3/2006 | Rayandayan et al. |
| 2007/0151581 | A1* | 7/2007 | Wang ................ C04B 41/009 134/26 |
| 2008/0223401 | A1* | 9/2008 | Augustino .......... C23C 16/4405 134/3 |
| 2008/0223725 | A1 | 9/2008 | Han et al. |
| 2009/0075486 | A1 | 3/2009 | Kikuyama et al. |
| 2012/0031559 | A1* | 2/2012 | Dhindsa ............ H01J 37/32091 156/345.26 |

FOREIGN PATENT DOCUMENTS

JP 2005/279481 10/2005

OTHER PUBLICATIONS

Search Report and Written Opinion for PCT/US2013/052202, mailed Nov. 12, 2013.

* cited by examiner

*Primary Examiner* — Michael Kornakov
*Assistant Examiner* — Ryan Coleman
(74) *Attorney, Agent, or Firm* — Lowenstein Sandler LLP

(57) ABSTRACT

A method including immersing a ceramic coated article into a bath including an HF acid solution having $NH_4F$ with a molar concentration of about 0.1M to 1.0M for a time period to remove a deposition, and rinsing the ceramic coated article.

16 Claims, 7 Drawing Sheets

ENHANCED CLEANING PROCESS OF CHAMBER USED PLASMA SPRAY COATING WITHOUT DAMAGING COATING

PRIORITY CLAIM

This application claims the benefit of U.S. Provisional Application Ser. No. 61/676,822 filed on Jul. 27, 2012, which is hereby incorporated by reference.

TECHNICAL FIELD

Embodiments of the present invention relate, in general, to a cleaning process that may be used to clean ceramic articles and ceramic coated articles.

BACKGROUND

A deposition of SiOx can form over time on plasma spray coated components used in semiconductor manufacturing. It is preferable to clean this SiOx deposition without damaging the plasma spray coating on the components. However, a conventional method of using pure HF acid to remove the SiOx deposition can also attack the coating surface causing damage to the plasma spray coating.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
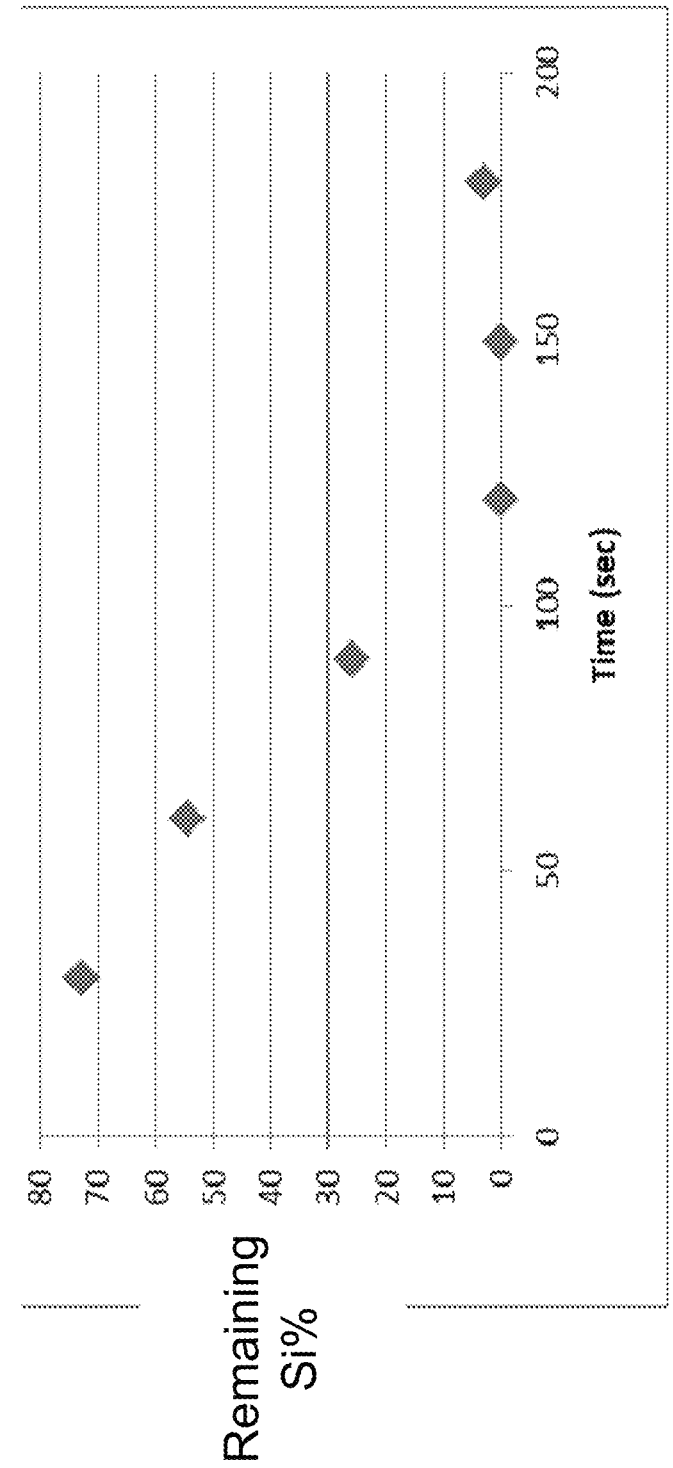
FIG. 1 illustrates remaining silicon deposits on a chamber component over immersion time in a cleaning solution according a method of one embodiment.

Embodiments are directed to a process for cleaning a ceramic article or an article that has a ceramic coating. Embodiments of the present invention provide a buffered HF acid chemistry that maintains a SiOx removal effectiveness while minimizing and/or alleviating substrate damage (e.g., damage to a ceramic coating). A method according to one embodiment can include immersing a ceramic coated article into a bath including an HF acid solution having $NH_4F$ with a molar concentration of about 0.1M to 1.0M for a time period to remove a deposition; and rinsing the ceramic coated article.

During processing, semiconductor manufacturing chamber components that are exposed to plasma can receive a deposition of SiOx. The chamber components may be, for example, lids, showerheads, chucks, chamber walls, nozzles, gas delivery hub, liner kit parts, and so forth. These chamber components may be ceramic components or may be ceramic coated components. This SiOx layer on the chamber components may periodically be cleaned using a wet clean or dry clean process.

HF acid may be used to clean semiconductor manufacturing components with a plasma spray coating, but it is highly acidic (e.g., pH equals about 2), which can damage the plasma spray coating. Additionally, use of HF acid may damage the surface of semiconductor manufacturing components that include bulk ceramics. It is preferable to clean the SiOx deposition on the components without damaging the underlying coating surface (e.g., to remove the SiOx layer without damaging the ceramic coating) or bulk ceramic surface. According to one embodiment, a buffered acid solution, which is a mixture of acid, a buffer and $H_2O_2$, may be used to clean the deposition of SiOx. One example buffer that may be used is $NH_4F$.

In one embodiment, the pH of HF acid is increased by adding a buffer. This may result in a buffered HF acid mixture having a pH of about 4. By increasing the pH of the solution, Zeta potential is increased. Zeta potential is electrokinetic potential in colloi systems. Change of the Zeta potential reduces the surface charge on cleaned components to lessen damage to the component caused by the HF. Additionally, change of the Zeta potential helps clean very small surface particles from the component.

In one embodiment, a concentration of less than about 1% HF acid (e.g., about 0.5% HF acid) is buffered in a solution including $NH_4F$, with a molar concentration in a range from about 0.1M to about 1M (e.g., about 0.5M), and $H_2O_2$ in a range from about 1% to about 15% (e.g., about 10%). SiOx deposition can more effectively be removed if it is in an $SiO_2$ form. When $H_2O_2$ reacts with SiOx, it aids in the formation of $SiO_2$ and eases the removal of the overall deposition In one embodiment the substrate can be ceramic, metal (such as Al), or another material. A coating on the substrate can be Yttria ($Y_2O_3$) a Yittria based High Performance Material (HPM), Yttria stabilized zirconia (YSZ), $Y_3Al_5O_{12}$ (YAG,) Alumina, $YF_3$, $Y_4Al_2O_9$ $Al_2O_3$ (YAM), Quartz, SiC, $Si_3N_4$, MN, $ZrO_2$, or other ceramics. The HPM may be composed of a compound $Y_4Al_2O_9$ (YAM) and a solid solution $Y_2-xZr_xO_3$ ($Y_2O_3$-$ZrO_2$ solid solution). In one embodiment, the HPM ceramic composite contains 77% $Y_2O_3$, 15% $ZrO_2$ and 8% $Al_2O_3$. In another embodiment, the HPM ceramic composite contains 63% $Y_2O_3$, 23% $ZrO_2$ and 14% $Al_2O_3$. In still another embodiment, the HPM ceramic composite contains 55% $Y_2O_3$, 20% $ZrO_2$ and 25% $Al_2O_3$. Other distributions of these ceramic powders may also be used for the HPM material. The ceramic coating may be pure yttrium oxide or a yttrium oxide containing solid solution that may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. In one embodiment, the ceramic coating is a yttrium oxide containing ceramic or other yttrium containing oxide that is deposited on a metal or ceramic substrate using a thermal spraying technique or plasma spraying technique. In alternative embodiments, chamber components that are composed of a bulk ceramic may also be cleaned. Such bulk ceramics may be any of the above mentioned ceramics.

In one embodiment, the components can be submerged into the acid solution during the cleaning process. Complete submersion of the component can improve repeatability and be an effective technique to clean the component. However, this mixture can also be applied on the surface with cloth (e.g., by wiping) to remove a buildup of SiOx.

FIG. 1 shows the effectiveness of removing SiOx deposition using a buffered HF acid solution as a percentage of remaining Si on a surface of a cleaned chamber component over time. Here, a semiconductor manufacturing component was submerged in a cleaning solution according to one embodiment. After 120 seconds of submersion, the deposition was removed. In one embodiment, the time period for submersion is about 90 seconds (e.g., about 90 seconds for each 60 nm of deposition or about 0.6 nm/second). However, effectiveness of the cleaning solution may deteriorate with use, and the cleaning solution may be replaced after a number of uses (e.g., after 20-25 components have been cleaned using the buffered HF solution).

Figure 2B:
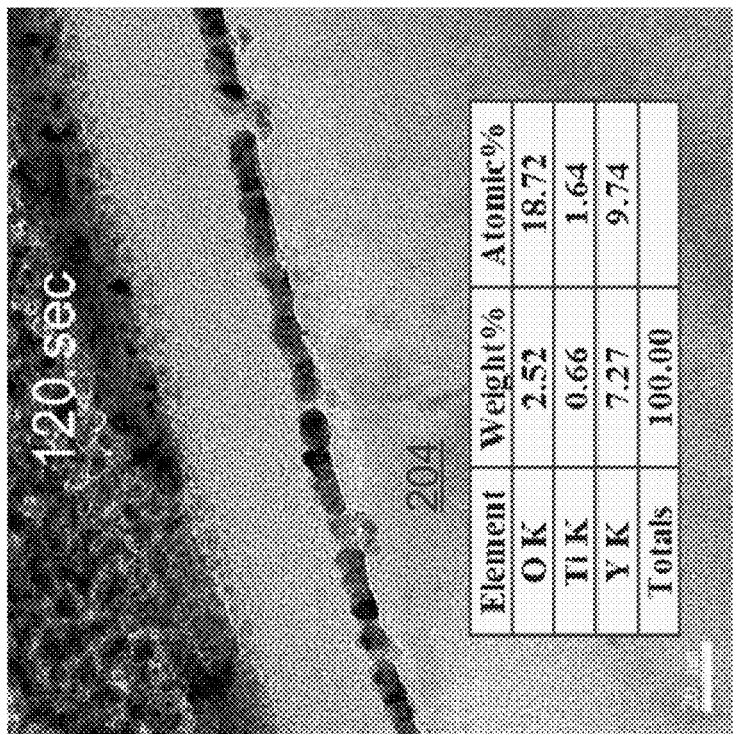
FIG. 2B illustrates a cross-sectional TEM view of an article subsequent to cleaning according to a method of one embodiment.
Figure 2A:
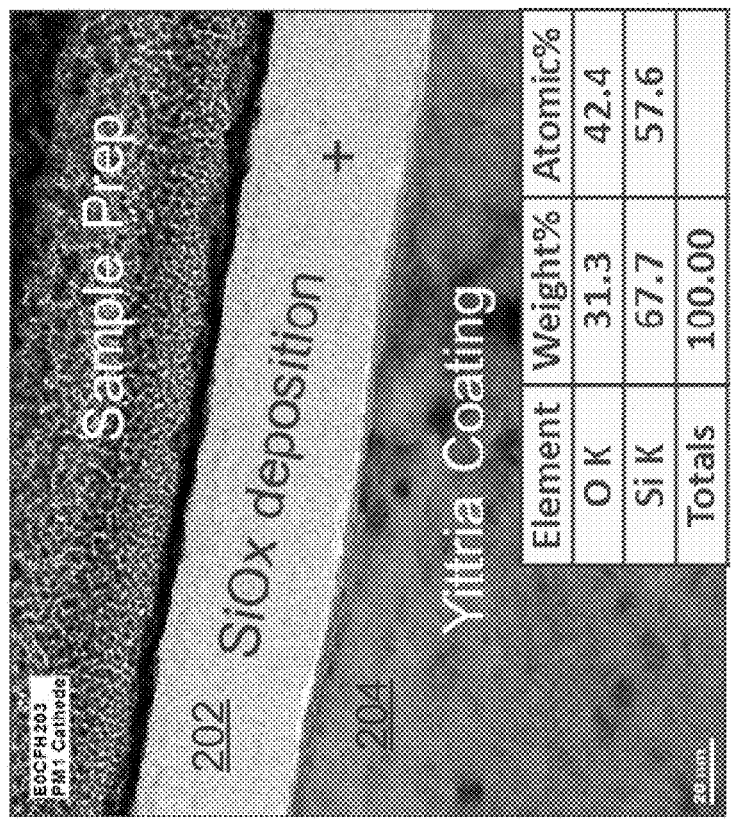
FIG. 2A illustrates a cross-sectional transmission electron microscope (TEM) view of an article prior to cleaning.

FIG. 2A illustrates a cross-sectional TEM view of a component prior to cleaning. Here, a layer of SiOx deposition 202 that has built up with use in a semiconductor manufacturing chamber can be seen over a Yttria coating 204 on the component. Further, a presence of Si on the component is shown in the energy-dispersive x-ray spectroscopy (EDS) analysis.

FIG. 2B illustrates a cross-sectional TEM view of a component subsequent to cleaning using a buffered HF acid solution according to a method of one embodiment. Here, the layer of SiOx deposition is not present on the Yttria coating 204. Further, EDS analysis does not indicate the presence of Si on the component.

Figure 3:
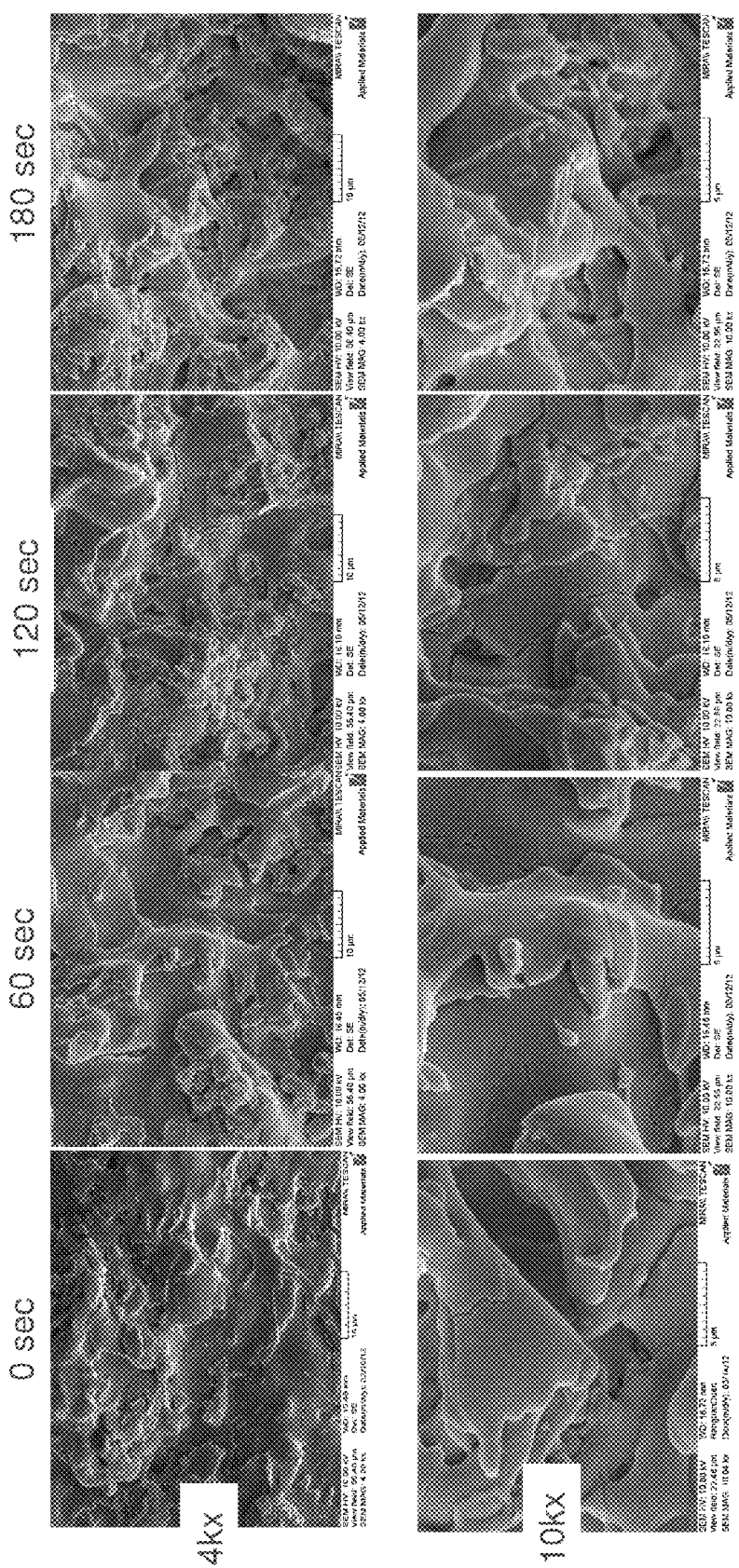
FIG. 3 illustrates top scanning electron microscope (SEM) views of articles after various immersion times in a cleaning solution according to a method of one embodiment.

So that performance of the component is not adversely affected, the cleaning process should cause minimal or no damage to the coating surface during removal of the surface deposition of $SiO_x$. FIG. 3 illustrates top scanning electron microscope (SEM) views at 4 kx and 10 kx of components after various immersion times in a buffered HF acid solution according to a method of one embodiment. Here, plasma spray Yttria coupons have been exposed to the buffered HF cleaning solution for various time periods, including at 0 seconds (or no exposure), at 60 seconds, at 120 seconds, and at 180 seconds. The SEM images indicate no detectable surface damage.

Figure 4A:
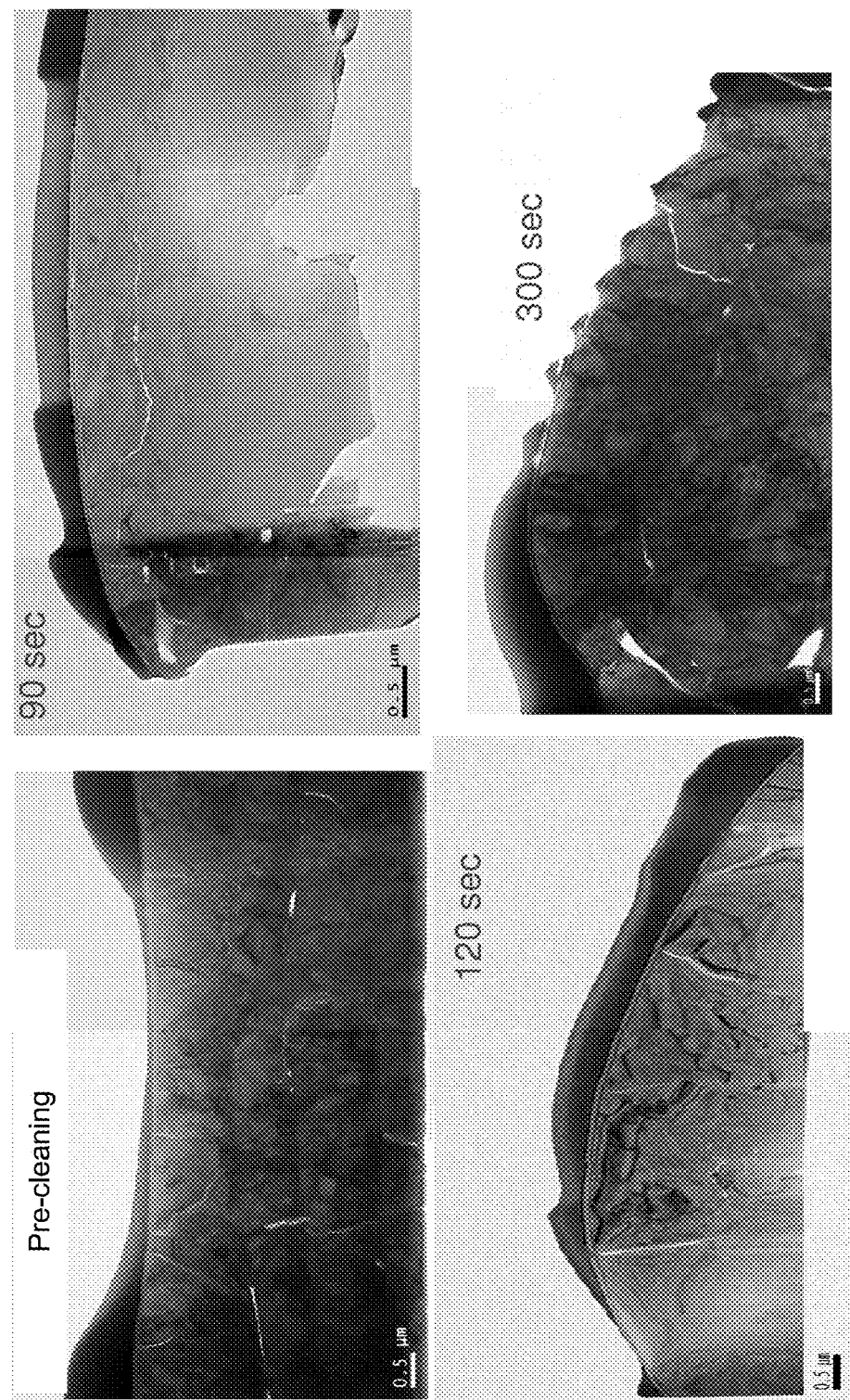
FIG. 4A illustrates cross-sectional TEM views of articles after various immersion times in a cleaning solution according to a method of one embodiment.
Figure 4B:
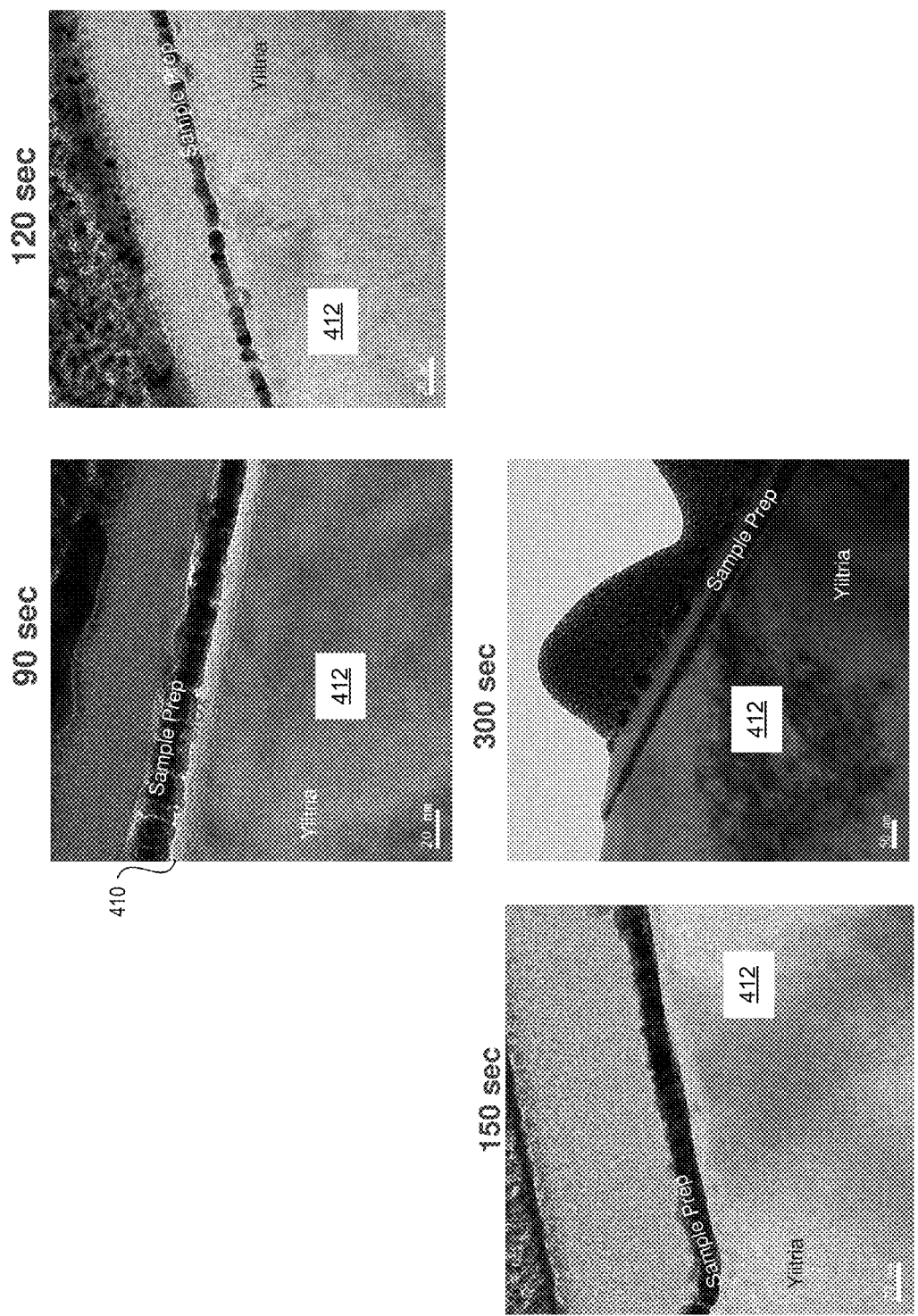
FIG. 4B illustrates cross-sectional TEM views of articles after various immersion times in a cleaning solution according to a method of one embodiment.

FIGS. 4A illustrates cross-sectional TEM views of components with no $SiO_x$ deposition pre-cleaning and at 90 seconds, 120 seconds, and 300 seconds of cleaning in a buffered HF solution. The TEM images indicate no detectable surface damage. FIGS. 4B and 4C illustrate cross-sectional TEM views of components with a Yttria coating 412 (i.e., a plasma spray coating) both pre-cleaning and after various immersion times in a buffered HF bath according to a method of one embodiment. In FIG. 4B, at 90 seconds, the $SiO_x$ deposition 410 is still present on the Yttria coating 412. However, at 120 seconds, 150 seconds, and 300 seconds, $SiO_x$ deposition is not present and the Yttria coating 412 is undamaged.

Figure 5:
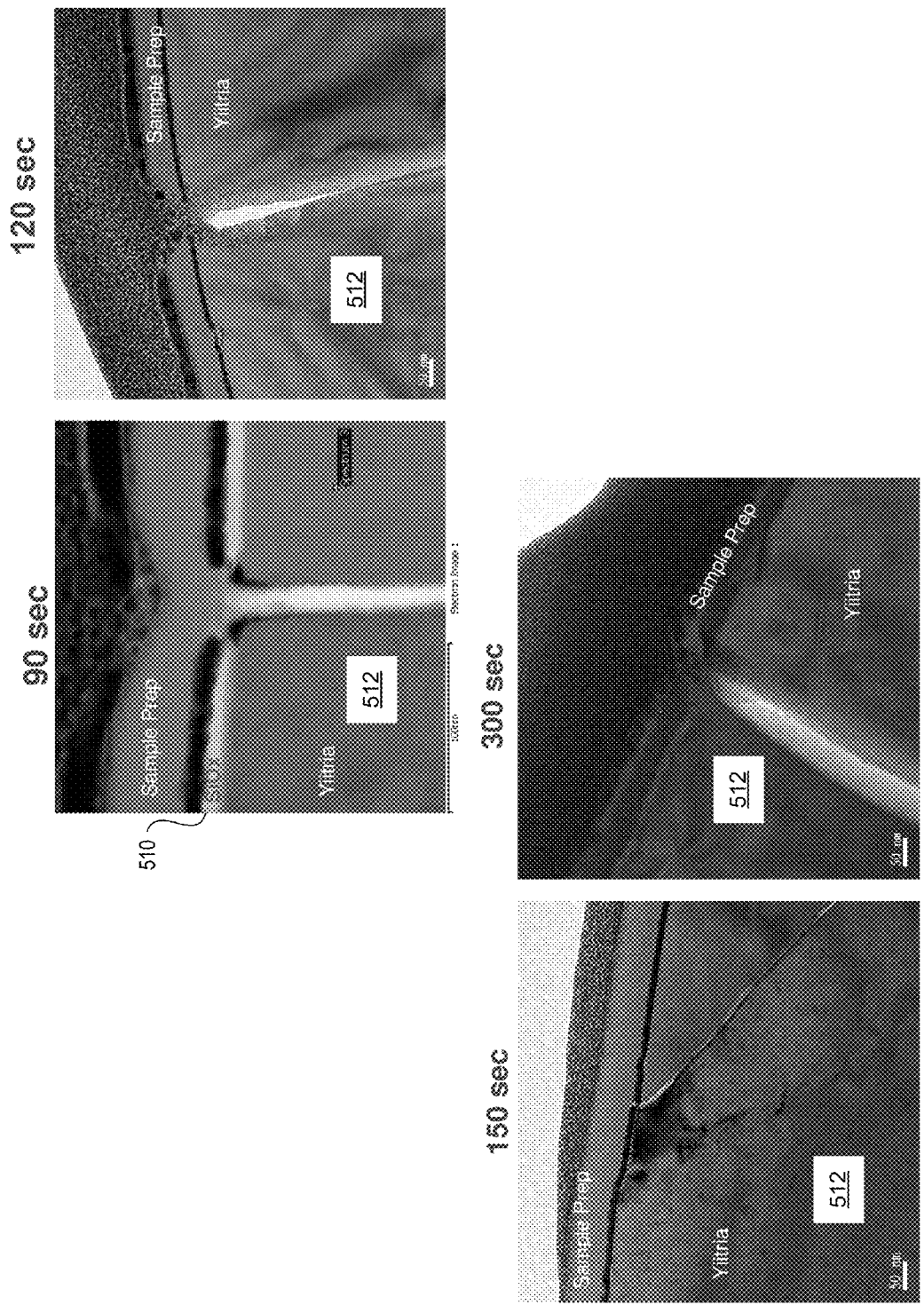
FIG. 5 illustrates cross-sectional TEM views of articles after various immersion times in a cleaning solution according to a method of one embodiment.

FIG. 5 shows a crack in the Yttria coating 512 that was present prior to the cleaning process. FIG. 5 shows that the crack is still present and visibly unaffected at 90 seconds, at 120 second, at 150 second and at 300 seconds. The SiOx deposition 510 is still present on the Yttria coating 512 at 90 seconds, but is removed at 120 seconds, 150 seconds, and 300 seconds, and the Yttria coating 512 appears to be undamaged, including no change in the number or size of the cracks, even after 300 seconds of immersion in the buffered HF acid solution.

Semiconductor manufacturing components, including chamber lower liner and upper liner kit components, may be cleaned via the cleaning process described herein. Further, these components may be installed in a semiconductor manufacturing chamber to test for particles. A test for particle performance over time of an article pre-cleaning and post-cleaning according to a method of one embodiment has shown that particle adders (i.e., particles dislodged from components during semiconductor manufacturing that may degrade semiconductor performance) do not increase after the component has been cleaned. For example, particle adders at 45 nm ranged from about 1 to about 20 pre-cleaning, and particle adders at 45 nm ranged from about 0 to about 35 post-cleaning. Accordingly, cleaning in the buffered HF acid solution does not damage the surface of the plasma spray coating.

Figure 6:
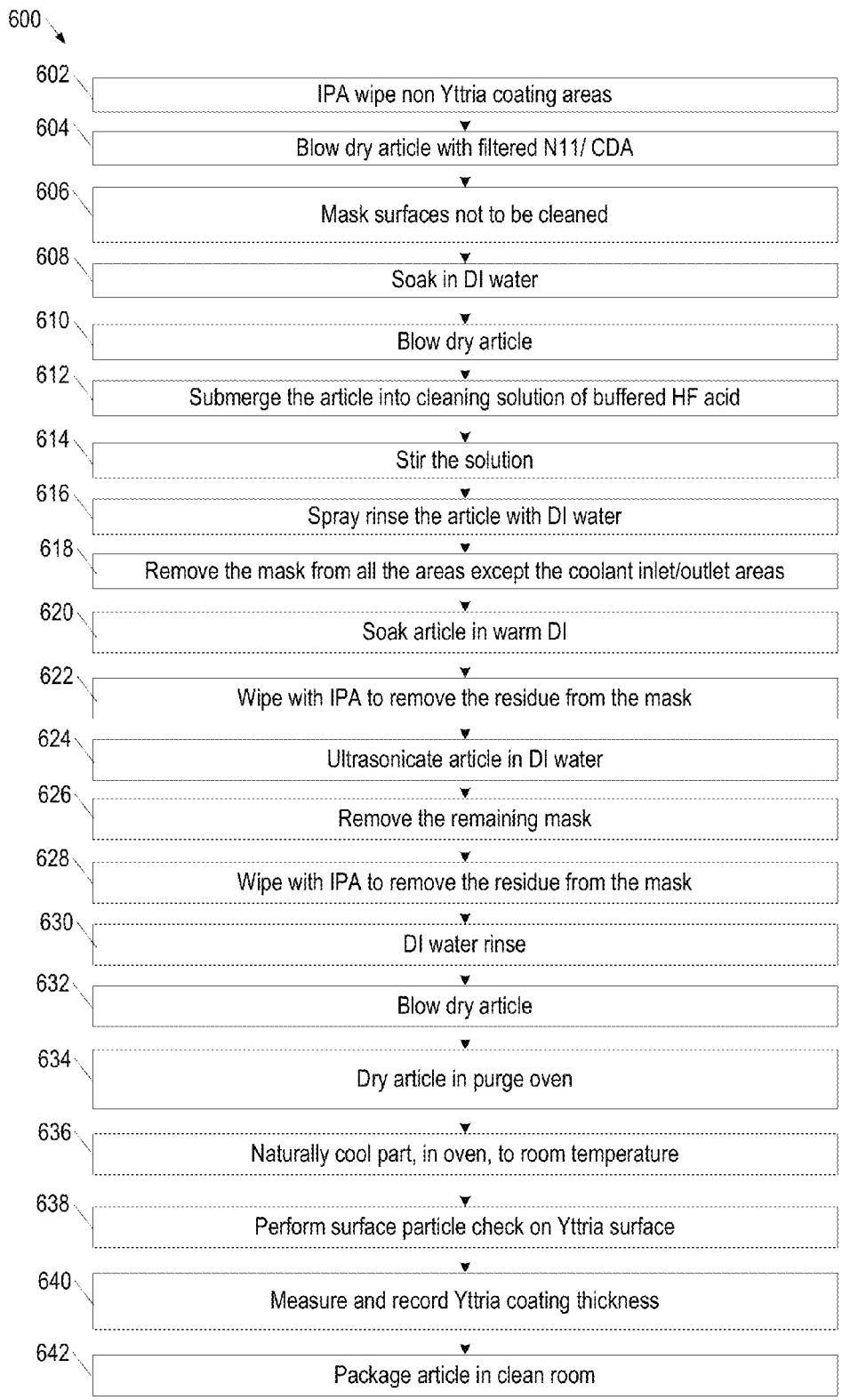
FIG. 6 illustrates a method of cleaning according to one embodiment.

FIG. 6 illustrates a method of cleaning processor chamber components using a buffered HF acid solution according to one embodiment. For example, the cleaning process can be used for cleaning an aluminum component with a ceramic coating (e.g., a Yttria ($Y_2O_3$) plasma spray coating). The cleaning method may be used for Yttria coated components used in, for example, conductor etch chambers. Conductor etch is one example of a form of plasma processing used to fabricate integrated circuits on conductive materials, such as metal wafers, with a high-speed stream of plasma of an appropriate gas mixture directed at a substrate. This procedure covers the recycle cleaning of chamber-used $Y_2O_3$ spray-coated aluminum components, but may also be applied to other ceramic coated articles.

Tools and materials that may be used to perform the cleaning process include chemical resistant gloves, eye protection, a deionized (DI) water tank or sink, an ultrasonic cleaning tank, compressed hot dry nitrogen, polyester heat-sealed polynet class 10 cloth wipes, a vacuum oven or nitrogen purge oven, a particle counter, a 6 mils polyethylene bag, a 4 mils polyethylene bag, IPA (electronic grade), acetone (electronic grade), HF (electronic grade), $H_2O_2$ (electronic grade), $NH_4F$ (electronic grade), an ultrasonic tank with cover and proper ventilation, and ultrasonic power (40 KHz, 50 Watt/gallon).

At block 602, non-Yttria coating areas may be wiped with IPA. At block 604, the component may be blow dried with filtered $N_2$/clean dry air (CDA) at room temperature for at least about 2 minutes. At block 606, O ring grooves, RF gasket grooves, weld cover, coolant inlet/outlet areas and Ni plated surfaces may be masked. At block 608, a room temperature DI water soak may be performed for about 10 minutes. At block 610, the component may be blow dried with filtered $N_2$/CDA at room temperature for at least about 2 minutes.

At block 612, according to one embodiment, the component is fully submerged into the cleaning solution. In one embodiment, the cleaning solution is less than about 1% HF and about 0.1 to about 1.0 M $NH_4F$. Optionally, about 1% to about 15% $H_2O_2$ mixture may also be included in the cleaning solution. The component may be submerged in the cleaning solution for about 90 seconds in one embodiment. Alternatively, the component may be submerged in the cleaning solution for greater than 90 seconds (e.g., 100 seconds, 120 seconds, or longer). At block 614, the solution may be stirred occasionally while the component is immersed in the cleaning solution. This may keep the solution on the component fresh (continuously exposing the component to new HF and NH$_4$F molecules). At block 616, the component may be spray rinsed with DI water for at least about 10 minutes.

At block 618, the mask may be removed from all the areas except for coolant inlet/outlet areas of the component. For example, the mask may be left on the inlet/outlet areas of the component to prevent water from entering during the subsequent DI water soak. At block 620, the component may be soaked in warm DI water (e.g., about 38 degrees C. to about 42 degrees C.) for about 30 minutes. At block 622, the component may be wiped with IPA to remove the residue from the mask.

At block 624, the component may be ultrasonicated in DI water for about 5 minutes to about 2 hours (e.g., about 40 minutes) at about 10 Watt per square inch (+/− about 2 Watts per square inch). The component may be rotated about every 10 minutes during the ultrasonicating.

At block 626, the remaining mask may be removed from the component. At block 628, the component may be wiped with IPA to remove the residue from the mask. At block 630, a DI water rinse may be performed for at least 10 minutes. At block 632, the component may be blown dry with filtered N$_2$/CDA at room temperature. Note that in one embodiment, for all baking processes, the oven is not pre-heated.

At block 634, the component may be dried in a filtered N$_2$ or CDA purge oven (e.g., a vacuum oven) at about 90 degrees C. to about 95 degrees C for at least about 3 hours. At block 636, the component may be naturally cooled, in the oven, to room temperature. The component may be ramped up to temperature slowly (e.g., about 3 degrees C. per minute), baked for the specified time, and cooled slowly (natural cooling) to room temperature, such that the component is not thermally shocked.

At block 638, a surface particle check may be performed on the Yttria surface. At block 640, the Yttria coating thickness, for each component, may be measured and kept on record at the end of the wet-clean process. At block 742, the component may be packaged in a clean room. In one embodiment, the total ultrasonic time for the entire cleaning process may be recommended to not exceed 1 hour.

In one embodiment, with regards to the above example cleaning process, the following techniques can be observed. Components and assemblies may be handled with talc free vinyl, clean room gloves. Acid-resistant gloves and clean room gloves may be used during wet cleaning. Gloved hands that touch clean components may touch only clean components. A Class 1000 or better clean room may be employed for final cleaning, drying, final inspection and packaging. Tooling, fixtures and hardware accessories used for cleaning may meet contamination and cleanliness requirements, and be suitable for a cleaning process. The cleaning process may not chip, scratch, pit, or damage the component surface. The baths may be free of any surface films that might contaminate the component on entry or withdrawal from the solution. The tanks may be covered when they are not in use. De-ionized water rinses may have a resistivity of 2 M-Ohms-cm or higher. Nitrogen or clean-dry-air (CDA) used to dry components may be dry, oil-free, and filtered at the point of use with a 0.1 micron filter. Ovens may meet cleanliness requirements, and they may be contamination particle qualified before component drying use.

Incoming and outgoing inspections may be performed. A bench top visual check can be performed for any chips, crack, scratches, or other unusual features. Any deviations from the usual can be recorded in cleaning logs against the serial number of the component. Similar inspection can be performed after the cleaning is completed, including a check for drying stain.

The following tests may be performed to assure component cleanliness quality. For contamination qualifications, the post-clean component may analyzed for surface trace metal contamination. Tests may be applied to one component for every ten components shipped in the same lot. The Yttria coated surface (at one location) may also be analyzed for surface trace metals by acidic extraction Inductively Coupled Plasma Mass Sectroscopy (ICP-MS) or another equivalent method. This test can be used to verify that adequate cleaning has occurred. The extraction area can then be rinsed with DI water (e.g., with a 18 Meg-ohm resistivity).

Before packaging, the components may be verified to be completely dry. In one embodiment, packaging may be done in a class 1000 clean room or better, or a class 100 or better clean room. Each component may be placed separately in an unused polyethylene (PE) bag, and double bagged (e.g., a 4 mil thick PE inner bag and a 6 mils thick PE outer bag). The bag can then be purged with 0.1 micron filtered dry nitrogen and vacuum heat-seal. In an embodiment, antistatic bags are not used. In one example, polyethylene bags should remain inside original bulk shipping container until ready for use, and bags may be pre-qualified for metal impurities and particles and only unpacked in the clean room.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." In one embodiment, the term "about" means plus or minus ten percent.

Although the operations of the methods herein are shown and described in a particular order, the steps of each method may be altered so that certain steps may be performed in a different order, or not at all, or so that certain steps may be performed, at least in part, concurrently with other operations. In another embodiment, some steps of the method are not performed.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
covering a plurality of portions of a ceramic coated article that are not covered by a ceramic coating with a mask;
submerging the ceramic coated article comprising the ceramic coating and a $SiO_x$ deposition in a bath comprising an HF acid solution for a time period to remove the $SiO_x$ deposition from the ceramic coated article without damaging the ceramic coating, wherein the HF acid solution comprises $NH_4F$ with a molar concentration of about 0.1-1.0 M and $H_2O_2$ wherein the $H_2O_2$ reacts with the SiOx deposition to cause formation of SiO2, wherein the HF acid solution removes the SiO2 from the ceramic coated article, and wherein the HF acid solution does not contact the plurality of portions of the ceramic coated article; and
rinsing the ceramic coated article.

2. The method of claim 1, wherein the ceramic coated article comprises one of an electrostatic chuck, a lid, a showerhead, nozzle, gas delivery hub, chamber liner kit parts, or a chamber wall.

3. The method of claim 1, wherein the HF acid solution comprises about 1.2 wt % to about 15 wt % $H_2O_2$.

4. The method of claim 1, wherein the HF acid solution comprises less than about 1 wt % HF.

5. The method of claim 1, wherein the $NH_4F$ has a molar concentration of about 0.5 M.

6. The method of claim 1, wherein the time period is about 90 seconds.

7. The method of claim 1, wherein the time period is about 90 seconds for each 60 nm of the $SiO_x$ deposition.

8. The method of claim 1, wherein the ceramic coated article comprises at least one of Al, AlN, or $Al_2O_3$, wherein the ceramic coating comprises Yttria, and wherein the HF acid solution removes the $SiO_x$ deposition without damaging the Yttria ceramic coating.

9. The method of claim 1, wherein rinsing the ceramic coated article comprises soaking the ceramic coated article in de-ionized water at a temperature of about 38 degree C. to about 42 degree C. for an additional time period.

10. The method of claim 1, wherein rinsing the ceramic coated article comprises spraying the ceramic coated article with de-ionized water for about 10 minutes.

11. The method of claim 9, wherein the time period that the ceramic coated article is soaked in de-ionized water is about 30 minutes.

12. The method of claim 1, further comprising ultrasonicating the rinsed component in de-ionized water for about 5 minutes to about 2 hours, wherein the ultasonicating is performed at a power of about 8 Watts per square inch to about 12 Watts per square inch.

13. The method of claim 1, wherein the plurality of portions of the ceramic coated article comprise at least one of a groove in the ceramic coated article, a weld cover, a coolant inlet, a coolant outlet, or a Ni plated surface.

14. The method of claim 1, further comprising:
removing a part of the mask from the ceramic coated article after rinsing the ceramic coated article, wherein a remainder of the mask covers at least one of a coolant inlet or a coolant outlet of the ceramic coated article; and
submerging the ceramic coated article in heated distilled water after removing the part of the mask.

15. The method of claim 14, further comprising:
removing the remainder of the mask after submerging the ceramic coated article in the heated distilled water;
performing an additional rinse of the ceramic coated article; and
drying the ceramic coated article in a heated oven.

16. The method of claim 1, wherein a first portion of the ceramic coated article comprises the ceramic coating and a second portion of the ceramic coated article does not have the ceramic coating, the method further comprising:
prior to submerging the ceramic coated article in the bath, performing the following comprising:
wiping the second portion of the ceramic coated article with alcohol; and
blow drying the ceramic coated article with a filtered mixture of $N_2$ and air.

* * * * *